United States Patent
Kaneyama

(10) Patent No.: US 11,652,402 B2
(45) Date of Patent: May 16, 2023

(54) SWITCHING APPARATUS AND ELECTRIC-POWER CONVERSION APPARATUS

(71) Applicant: Mitsubishi Electric Corporation, Tokyo (JP)

(72) Inventor: Takashi Kaneyama, Tokyo (JP)

(73) Assignee: Mitsubishi Electric Cornoration, Tokyo (JP)

( * ) Notice: Subject to any disclaimer, the term of this patent is extended or adjusted under 35 U.S.C. 154(b) by 0 days.

(21) Appl. No.: 17/388,122

(22) Filed: Jul. 29, 2021

(65) Prior Publication Data
US 2022/0077765 A1    Mar. 10, 2022

(30) Foreign Application Priority Data
Sep. 7, 2020  (JP) .............................. JP2020-149564

(51) Int. Cl.
| | | |
|---|---|---|
| G05F 1/46 | (2006.01) | |
| H03K 17/08 | (2006.01) | |
| H03K 17/0812 | (2006.01) | |
| H02M 1/32 | (2007.01) | |
| H02M 1/00 | (2006.01) | |
| H02M 1/088 | (2006.01) | |

(Continued)

(52) U.S. Cl.
CPC .......... *H02M 1/327* (2021.05); *H02M 1/0009* (2021.05); *H02M 1/088* (2013.01); *H02M 3/155* (2013.01); *G05F 1/463* (2013.01); *G05F 1/573* (2013.01); *H03K 17/08* (2013.01); *H03K 17/0812* (2013.01)

(58) Field of Classification Search
CPC .......... G05F 1/461; G05F 1/462; G05F 1/463; G05F 1/567; G05F 1/573; G05F 1/613; H03K 17/08; H03K 17/0806; H03K 17/0812
See application file for complete search history.

(56) References Cited

U.S. PATENT DOCUMENTS

| | | | |
|---|---|---|---|
| 2007/0284664 A1 | 12/2007 | Okuda et al. | |
| 2014/0091853 A1* | 4/2014 | Okano | ................... H03K 17/08 327/427 |
| 2017/0358512 A1* | 12/2017 | Kakimoto | .............. H03K 17/08 |

(Continued)

FOREIGN PATENT DOCUMENTS

JP          4177392 B2    11/2008

*Primary Examiner* — Gary A Nash
(74) *Attorney, Agent, or Firm* — Sughrue Mion, PLLC; Richard C. Turner

(57) ABSTRACT

The objective is to provide a function of detecting loss of a current detection function, at a time when a switching device has an open failure, in an arm that has the current detection function and a temperature detection function and in which two or more switching devices are connected in parallel with one another. A switching apparatus includes a current detector and a temperature detector provided in at least one of the two or more switching devices that are connected in parallel with one another and a controller that determines an overcurrent in the switching device in which the current detector is provided, that determines an overheating state and a temperature-rising failure in the switching device in which the temperature detector is provided, based on an output of the temperature detector, and that controls the switching devices.

20 Claims, 7 Drawing Sheets

(51) Int. Cl.
*H02M 3/155* (2006.01)
*G05F 1/573* (2006.01)

(56) References Cited

U.S. PATENT DOCUMENTS

| | | | |
|---|---|---|---|
| 2018/0088615 A1* | 3/2018 | Mori | G05F 1/575 |
| 2018/0102649 A1* | 4/2018 | Dewa | H02M 7/219 |
| 2018/0138904 A1* | 5/2018 | Nagase | H02M 1/08 |
| 2018/0269677 A1* | 9/2018 | Yamamura | H03K 17/08128 |
| 2019/0363706 A1* | 11/2019 | Shinomiya | H03K 17/06 |

* cited by examiner

SWITCHING APPARATUS AND ELECTRIC-POWER CONVERSION APPARATUS

BACKGROUND OF THE INVENTION

Field of the Invention

The present disclosure relates to a switching apparatus and an electric-power conversion apparatus utilizing the switching apparatus.

Description of the Related Art

With regard to an electric-power conversion apparatus in which two or more switching devices are incorporated, a protection function for failure has been proposed. In an electric-power conversion apparatus utilizing switching devices, each of which is formed of a semiconductor such as an IGBT (Insulated Gate Bipolar Transistor) or a MOSFET (Metal Oxide Semiconductor Field Effect Transistor), temperature rise in the switching device at a time of overloading or abnormal operation may cause damage to the switching device.

Accordingly, there has been proposed a switching apparatus having a protection means in which a temperature detector and a current detector are provided in a switching device so that an overheating state and an overcurrent are detected and then the output is limited or switching operation is stopped. In an electric-power conversion apparatus provided with an upper arm for supplying a positive-polarity current and a lower arm for supplying a negative-polarity current—the upper arm and the lower arm are connected in series with each other—, there is well known an electric-power conversion apparatus in which switching apparatuses are utilized as the upper arm and as the lower arm. Stopping of switching operation in order to protect a switching device also signifies that electric-power conversion operation is stopped.

Patent Document 1 discloses an overheat-protection method for an electric-power conversion apparatus provided with an arm formed of two switching devices that are connected in parallel with each other. One of the two switching devices connected in parallel with each other is provided with a temperature detector and the other one thereof is provided with a current detector, so that even when any one thereof has an open failure (in the case of an IGBT, an open failure between the collector and the emitter), the other switching device can perform protection operation at a time when a temperature threshold value or an overcurrent threshold value is exceeded. Such a method makes it possible to raise the redundancy and the reliability while protecting a sound switching device and suppressing a cost hike.

PRIOR ART REFERENCE

Patent Literature

[Patent Document 1] Japanese Patent No. 4177392

SUMMARY OF THE INVENTION

In Patent Document 1, out of the two switching devices connected in parallel with each other, a temperature-detectable device for detecting an overheating state and a current-detectable device for detecting an overcurrent are separately arranged. Therefore, when the current-detectable device has an open failure, the temperature-detectable device detects an abnormality. Practically, when one of the switching devices has an open failure, a double current flows into the other switching device. The temperature of the other switching device rises because a large current flows thereinto; the temperature detection device detects an overheating state; then, the output is limited or the switching operation is stopped. In this situation, although the overheating state has been detected, the current detector does not detect any overcurrent; therefore, it becomes clear that the output of the current detector is abnormal or that the foregoing switching device has an open failure.

However, it takes a time from a time point when a large current practically starts to flow in the switching device to a time point when the temperature detector detects a temperature rise in the device and starts to output a signal indicating an overheating state. While this time elapse, the electric-power conversion apparatus continues the operation without becoming aware that overcurrent detection cannot be performed. Moreover, in general, a temperature protection threshold value is set with a high margin, while considering various variations so that temperature protection does not function at a time of a maximum rated output. Accordingly, even when one of the two devices has an open failure, the operation may be continued under the condition that the temperature of the device does not reach the temperature protection threshold value when the electric-power conversion apparatus operates at electric power lower than the maximum rated output. Furthermore, in the case where a great number of switching devices are provided in a parallel manner and one of the switching devices has an open failure, the amount of an increase in conduction currents in other devices becomes smaller, as the number of switching devices increases, and the temperature rise also decreases; thus, because the difference between the temperature at a time of normal operation and the temperature at a time of the failure decreases, it is difficult to determine that an overheating state has occurred.

In this case, the switching apparatus or the electric-power conversion apparatus continues the operation without determining that the output of the current detector of the switching device is abnormal or that the foregoing switching device has an open failure. Detection of an overcurrent by the current detector is often utilized in short-circuit protection for detecting a short-circuit current at a time of malfunction (erroneous ON) or at a time of short-circuit failure so as to cut off the gate. Thus, because when an overcurrent cannot be detected, a short circuit in the upper and lower arms causes damage to the electric-power conversion apparatus, the power source, and the load, it is desirable that the loss of a current detection function can be rapidly detected.

The present disclosure has been implemented in order to solve the foregoing problem; the objective thereof is that in a switching apparatus in which two or more switching devices are connected in parallel with one another, there are provided functions of detecting overheating and loss of a current detection function in the switching devices having the current detection function and a temperature detection function. Moreover, the objective thereof is to obtain an electric-power conversion apparatus having functions of detecting overheating and loss of the current detection function in the switching devices by use of the foregoing switching apparatus in the electric-power conversion apparatus.

A switching apparatus according to the present disclosure includes
- two or more switching devices that are connected in parallel with one another and each of which switches conduction to/from cutoff between a first terminal and a second terminal in accordance with an input signal to a control terminal,
- a current detector and a temperature detector provided in at least one of the two or more switching devices, and
- a controller that is connected with the control terminal, the current detector, and the temperature detector, that switches on/off of the switching device, that determines an overcurrent in the switching device in which the current detector is provided, based on an output of the current detector, that determines overheating and a temperature-rising failure in the switching device in which the temperature detector is provided, based on an output of the temperature detector, and that controls the two or more switching devices, based on a result of a determination on the overcurrent and respective results on the overheating and the temperature-rising failure.

An electric-power conversion apparatus according to the present disclosure is characterized by having an upper arm and a lower arm that are connected in series with each other and that supply a positive-polarity current and a negative-polarity current, respectively, and in that the switching apparatus is utilized in each of the upper arm and the lower arm.

In a switching apparatus according to the present disclosure, a switching device, among switching devices that are connected in parallel with one another, that is provided with a current detector concurrently has a temperature detector; thus, provision of the temperature detector makes it possible to detect overheating and loss of a current detection function in the switching device provided with the current detector.

In an electric-power conversion apparatus according to the present disclosure, such a switching device is utilized in each of the upper arm and the lower arm; therefore, it is made possible to detect overheating and loss of a current detection function in the switching device provided with the current detector, among the switching devices utilized in the arms.

The foregoing and other object, features, aspects, and advantages of the present invention will become more apparent from the following detailed description of the present invention when taken in conjunction with the accompanying drawings.

DETAILED DESCRIPTION OF THE PREFERRED EMBODIMENTS

Hereinafter, Embodiments of a switching apparatus and an electric-power conversion apparatus according to the present disclosure will be explained with reference to the drawings.

1. Embodiment 1

<Configuration of Electric-Power Conversion Apparatus>

Figure 1:
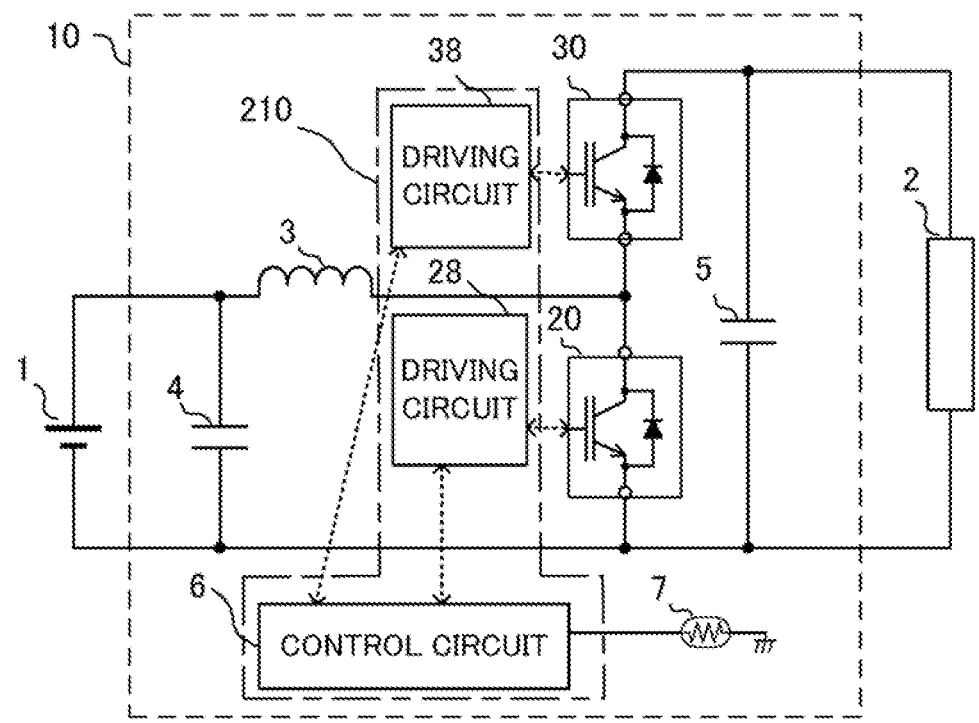
FIG. 1 is a configuration diagram of an electric-power conversion apparatus according to Embodiment 1.

FIG. 1 represents the configuration of an electric-power conversion apparatus 10. The electric-power conversion apparatus 10 has lower arms 20 in which as two or more switching devices, IGBTs are connected in parallel with one another and upper arms 30 in which as two or more switching devices, IGBTs are connected in parallel with one another. In FIG. 1, representation of the two or more IGBTs is omitted, and a single IGBT is represented as a representative. The connection point between the lower arm 20 and the upper arm 30, which are connected in series with each other, is connected with a reactor 3 and is connected with a power source 1 and an input capacitor 4 by way of the reactor 3. An output capacitor 5 and a load 2 are connected with the side opposite to the side of the connection point between the lower arm 20 and the upper arm 30. The control terminal of the switching device in the lower arm 20 and the control terminal of the switching device in the upper arm 30 are connected with a driving circuit 28 and a driving circuit 38, respectively; each of the driving circuits receives a command from a control circuit 6 and then transfers a driving signal to the control terminal of the corresponding switching device.

Each of the switching devices in the lower arm 20 and the upper arm 30 has a current detector and a temperature detector and transfers detection signals to corresponding one of the driving circuit 28 and the driving circuit 38. Each of the driving circuit 28 and the driving circuit 38 transfers the detection signals to the control circuit 6. The control circuit 6 receives information on a cooler temperature from a cooler-temperature detection thermistor 7. The control circuit 6 makes determination on an overcurrent, overheating, or a temperature-rising failure in the switching device and then reflects the determination result in control of the electric-power conversion apparatus 10. The electric-power conversion apparatus 10 represented in FIG. 1 is a DC-DC converter. A controller 210 includes the control circuit 6, the driving circuit 28, and the driving circuit 38.

<Hardware Configuration of Controller>

Figure 2:
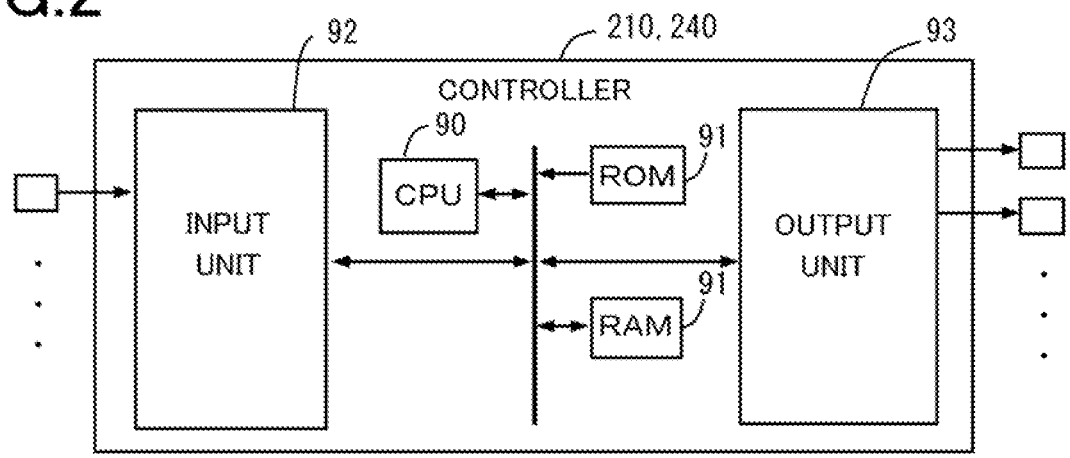
FIG. 2 is a hardware configuration diagram of a controller according to Embodiment 1.

FIG. 2 is a hardware configuration diagram of each of the controller 210 and a controller 240 (hereinafter, the controller 210 is explained; however, the configuration of the controller 240 is the same as that of the controller 210). In the present embodiment, the controller 210 is a control apparatus for controlling the electric-power conversion apparatus 10. Respective functions of the controller 210 are realized by processing circuits provided therein. Specifically, the controller 210 includes, as the processing circuits, a computing processing unit (computer) 90 such as a CPU (Central Processing Unit), storage apparatuses 91 that exchange data with the computing processing unit 90, an input unit 92 that inputs external signals to the computing processing unit 90, an output unit 93 that outputs signals from the computing processing unit 90 to the outside, and the like.

It may be allowed that as the computing processing unit 90, an ASIC (Application Specific Integrated Circuit), an IC (Integrated Circuit), a DSP (Digital Signal Processor), an FPGA (Field Programmable Gate Array), each of various kinds of logic circuits, each of various kinds of signal processing circuits, or the like is provided. In addition, it may be allowed that as the computing processing unit 90, two or more computing processing units of the same type or different types are provided and respective processing items are implemented in a sharing manner. As the storage apparatuses 91, there are provided a RAM (Random Access Memory) that can read data from and write data in the computing processing unit 90, a ROM (Read Only Memory) that can read data from the computing processing unit 90, and the like. The input unit 92 includes interfaces for the respective current detector and the respective temperature detector of the driving circuits 28 and 38; the input unit 92 is connected with various kinds of sensors and switches and is provided with A/D conversion units, input circuits, and the like for inputting output signals of these sensors and switches to the computing processing unit 90. The output unit 93 includes respective switching-device driving units of the driving circuits 28 and 38 and is connected with electric loads such the switching devices and actuators; the output unit 93 is provided with interface circuits such as a driving circuit and a communication circuit for converting output signals from the computing processing unit 90 and then outputting the converted signals to these electric loads.

The computing processing unit 90 runs software items (programs) stored in the storage apparatus 91 such as a ROM and collaborates with other hardware devices in the controller 210, such as the storage apparatus 91, the input unit 92, and the output unit 93, so that the respective functions provided in the controller 210 are realized. Setting data items such as a threshold value and a determination value to be utilized in the controller 210 are stored, as part of software items (programs), in the storage apparatus 91 such as a ROM.

It may be allowed that the respective functions mounted in the controller 210 in FIG. 1 are each configured with either software modules or combinations of software and hardware.

<Configuration of Switching Apparatus>

Figure 3:
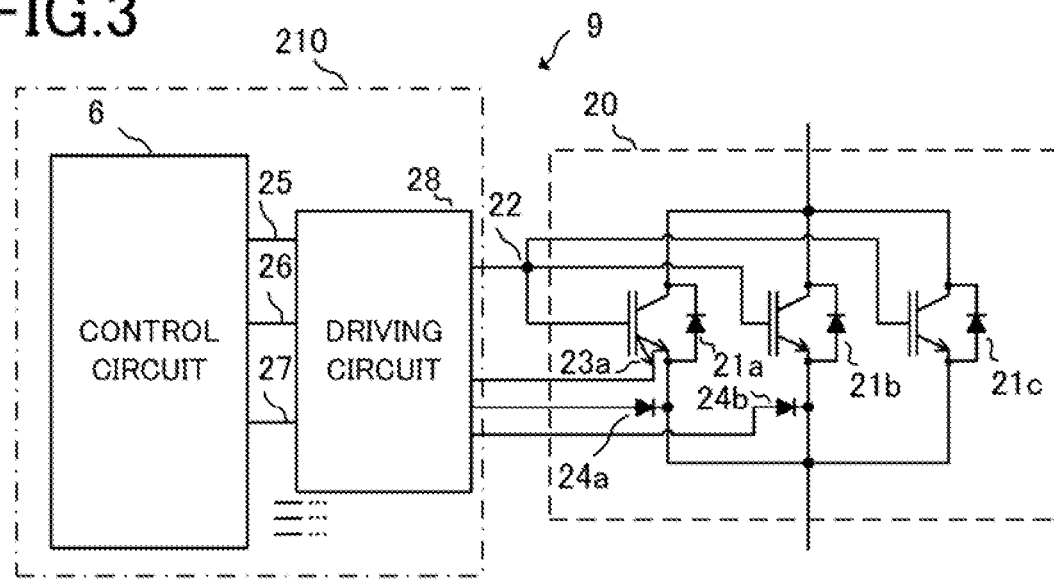
FIG. 3 is a configuration diagram of a switching apparatus according to Embodiment 1.

FIG. 3 represents a switching apparatus 9 including the lower arm 20, the driving circuit 28, and the control circuit 6. FIG. 3 represents the detail of the lower arm 20 including three IGBTs 21a, 21b, and 21c that are connected in parallel with one another and with each of which a diode is connected in an anti-parallel manner. The IGBT 21a has a current-detection cell 23a, which is a current detector, and transfers current information to the driving circuit 28. The IGBTs 21a and 21b have temperature-detection diodes 24a and 24b, respectively, which are temperature detectors, and each transfer temperature information to the driving circuit 28. The IGBT 21a has both a current detector and a temperature detector. Hereinafter, an IGBT (or MOSFET) having a current detector or a temperature detector will be referred to as an IGBT (or MOSFET) having a current detection function or a temperature detection function.

The respective gate terminals of the IGBTs 21a, 21b, and 21c are connected with one another by a common gate driving signal line 22; a gate signal to be outputted from the driving circuit 28 on/off-drives the IGBTs 21a, 21b, and 21c. The driving circuit 28 outputs, as a gate driving signal, a PWM (Pulse Width Modulation) signal 25 outputted from the control circuit 6 to the gate driving signal line 22.

The driving circuit 28 has an overcurrent protection means, receives current information from the current-detection cell 23a so as to perform overcurrent protection, and transmits an overcurrent abnormality signal 26 to the control circuit 6. The driving circuit 28 transmits, as a temperature signal 27, temperature information pieces received from the temperature-detection diodes 24a and 24b to the control circuit 6; a temperature abnormality detector provided in the control circuit 6 detects a temperature abnormality in any of the IGBTs 21a and 21b.

In FIG. 3, the lower arm 20 is explained; however, the configuration of the upper arm 30 is the same as that of the lower arm 20. The detailed configuration of the upper arm 30 is not represented in FIG. 3; however, in the upper arm 30, three IGBTs 31a, 31b, and 31c are connected in parallel with one another and there are provided a current-detection cell 33a and two temperature-detection diodes 34a and 34b; the IGBT 31a has both a current detector and a temperature detector. A PWM signal 35 to be outputted from the control circuit 6 is outputted to a gate driving signal line 32 by way of the driving circuit 38. The driving circuit 38 outputs an overcurrent abnormality signal 36 and a temperature signal 37 to the control circuit 6.

In FIG. 3, the case where as the switching device, an IGBT is utilized is explained; however, a semiconductor device of another type, such as a MOSFET, may be utilized. In addition, it may be allowed that the discrete IGBT represented in FIG. 3 is other than an RC-IGBT (Reverse Conducting IGBT) having an anti-parallel diode and that respective diodes, the number of which is different from the number of IGBTs connected in parallel with one another, are connected with the IGBTs in an anti-parallel manner.

<Electric-Power Conversion>

Electric-power conversion operation by the electric-power conversion apparatus 10 will be explained. The lower arm 20 in FIG. 1 is turned on and the upper arm 30 is turned off, so that the reactor 3 is energized; the lower arm 20 is turned off and the upper arm 30 is turned on, so that the reactor 3 is reset. Such switching operation is performed at a predetermined frequency and the respective durations of the energization and the reset are controlled at a predetermined duty ratio (the ratio of the ON state of the lower arm), so that voltage boosting is performed.

<Detection of Overcurrent>

The overcurrent protection means in each of the driving circuit 28 and the driving circuit 38 will be explained. It is assumed that the overcurrent protection here is short-circuit protection in which when both the upper and lower arms become conductive and hence an excessive short-circuit current instantaneously flows therein, any one of the arms is turned off so as to cut off the short-circuit current.

Figure 4:
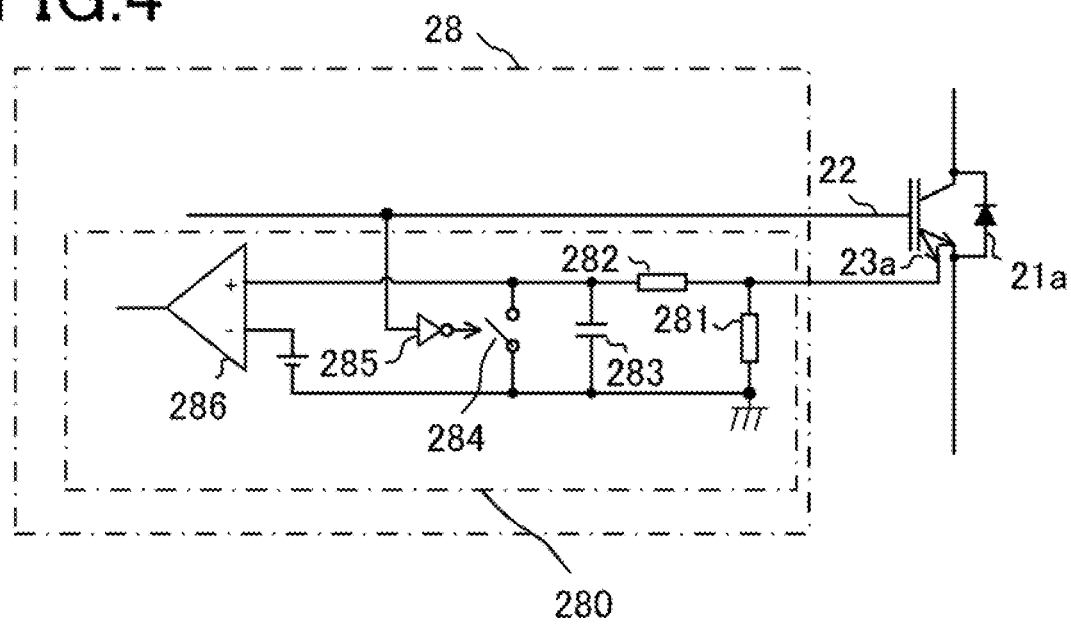
FIG. 4 is a configuration diagram of a current detection circuit according to Embodiment 1.

FIG. 4 is a configuration diagram of a current detection circuit according to Embodiment 1. Here, there will be described an example in which a current is detected through a sensing method. In the sensing method, part of a main-circuit current flowing in the switching device is separated for a sensing terminal, so that a current is taken out. For example, in the case of an IGBT (Insulated Gate Bipolar Transistor), part of a main-circuit current is made to ramify from the emitter and in the case of a MOSFET (Metal Oxide Semiconductor Field Effect Transistor), part of a main-circuit current is made to ramify from the source, so that current is taken out. This current is converted into a voltage by use of a resistor, and then the voltage level is monitored, so that an overcurrent is detected. The driving circuit 28 includes a current detection circuit 280. The configuration of the driving circuit 38 is the same as the foregoing configuration; however, the explanation therefor will be omitted here. The ramified current from the current-detection cell 23*a* are separated into two currents; the respective separate currents are inputted to a comparator 286 by way of a parallel resistor 281 and a series resistor 282 and are compared with each other, so that it is detected whether or not an overcurrent exists.

In this situation, in order to eliminate the effect of noise, a capacitor 283 is connected before the comparator 286. Each time the IGBT 21*a* is turned on by a PWM switching signal and hence becomes conductive, the capacitor 283 is charged. When the capacitor 283 is charged continuously, there is posed a problem that the voltage across the capacitor 283 increases and hence an overcurrent is erroneously detected. Therefore, when the gate is off, the capacitor 283 is made to discharge and is reset through a discharging switch 284. The gate signal on the gate driving signal line 22 drives the discharging switch 284 by way of a NOT-logic driving device 285. This kind of operation makes it impossible to detect an overcurrent while the gate is off and makes it possible to detect an overcurrent while the gate is on. The circuit in FIG. 4 is an example; the configuration is not limited thereto, as long as any other circuit operates in the same manner. When an overcurrent is detected, each of the driving circuits 28 and 38, for example, turns off the gate and then performs operation of transmitting the fact that the overcurrent has been detected.

During normal operation for performing electric-power conversion, exclusive-logic switching operation is applied to the lower arm 20 and the upper arm 30 in such a way that when the lower arm 20 is on, the upper arm 30 becomes off and that when the upper arm 30 is on, the lower arm 20 becomes off. Accordingly, no short-circuit occurs during the normal operation. At an abnormal time, for example, in the case where when the lower arm 20 is off and the upper arm 30 is on, noise or abnormal control causes the lower arm 20 to be erroneously turned on or to have collector-emitter short-circuit failure, a short-circuit current flows in the upper and lower arms; thus, the on-state upper arm detects an overcurrent. In this situation, short-circuit protection is performed by cutting off the gate. In contrast, in the case where the respective on/off-states of the upper and lower arms are opposite to those in the foregoing case, the on-state lower arm detects an overcurrent and hence short-circuit protection is performed.

At this time, there will be considered the case where due to an open failure in the IGBT having an overcurrent detector, the arm at the side for detecting an overcurrent has lost an overcurrent detection function. In the case where the IGBT has a disconnection failure, no current flows in the sensor terminal and hence overcurrent detection cannot be performed; therefore, gate cutoff for cutting off a short-circuit current cannot normally be performed. Because no current flows in the defective IGBT, a current excessively flows when other IGBTs parallel to the defective IGBT are conductive. When in the foregoing condition, the upper arm or the lower arm in a pair has a short-circuit failure, an overcurrent flows in the upper and lower arms; on top of it, overcurrent detection cannot be performed.

When due to an voltage exceeding the breakdown voltage or overheating caused by an excessive surge voltage at a time when the gate is cut off, the IGBT is short-circuited, a short-circuit of the power source 1 or the load 2 may enlarge the damage. Even when each of the upper arm and the lower arm has the current detector, a large problem is posed when any one of the current detection functions is lost. In the case where as described above, there is provided an overcurrent detection circuit having a period in which no overcurrent is detected, it is required that whether or not the current detection function has been lost is determined in each of the arms. In Embodiment 1 of the present disclosure, it is significant that in order to be able to detect the foregoing loss of the current detection function, the switching device having a current detector is concurrently provided with a temperature detector, as the configuration represented in FIG. 3, so that a temperature abnormality is detected.

<Abnormality Determination through Temperature Detection>

Next, disconnection determination by the temperature detector will be explained. The method of detecting an abnormality and the operation at a time of a temperature abnormality will be explained. As represented in FIGS. 1 and 3, the control circuit 6 can detect the IGBT temperatures of the IGBTs 21*a* and 21*b*, which are each transmitted, as temperature signals 27, from the driving circuit 28, and the cooler temperature, which is transmitted from the cooler-temperature detection thermistor 7, and detects a temperature abnormality.

When any one of the IGBT temperatures or the cooler temperature exceeds a predetermined temperature, the control circuit 6 determines that overheating has occurred and then performs overheating protection. As the overheating protection, the electric-power conversion operation is continued with decreased output electric power or the electric-power conversion operation is stopped. In addition to that, the following procedure makes it possible to determine a temperature-rising failure from each of the IGBT temperatures. The temperature-rising failure signifies that although the temperature of the switching device should appropriately be raised by being continuously on/off-driven (duty-driven), the temperature rise is not sufficient. In this case, the IGBT cannot normally supply an electric current; thus, there is caused loss of the current detection function of the IGBT for detecting an overcurrent in the switching apparatus 9. As one of the factors of the loss of the current detection function, disconnection in the IGBT is conceivable. Hereinafter, "the determination of a temperature-rising failure" signifies making a determination that temperature rise is not sufficient.

<Flowchart of Temperature-Rising Failure Determination>

Figure 5:
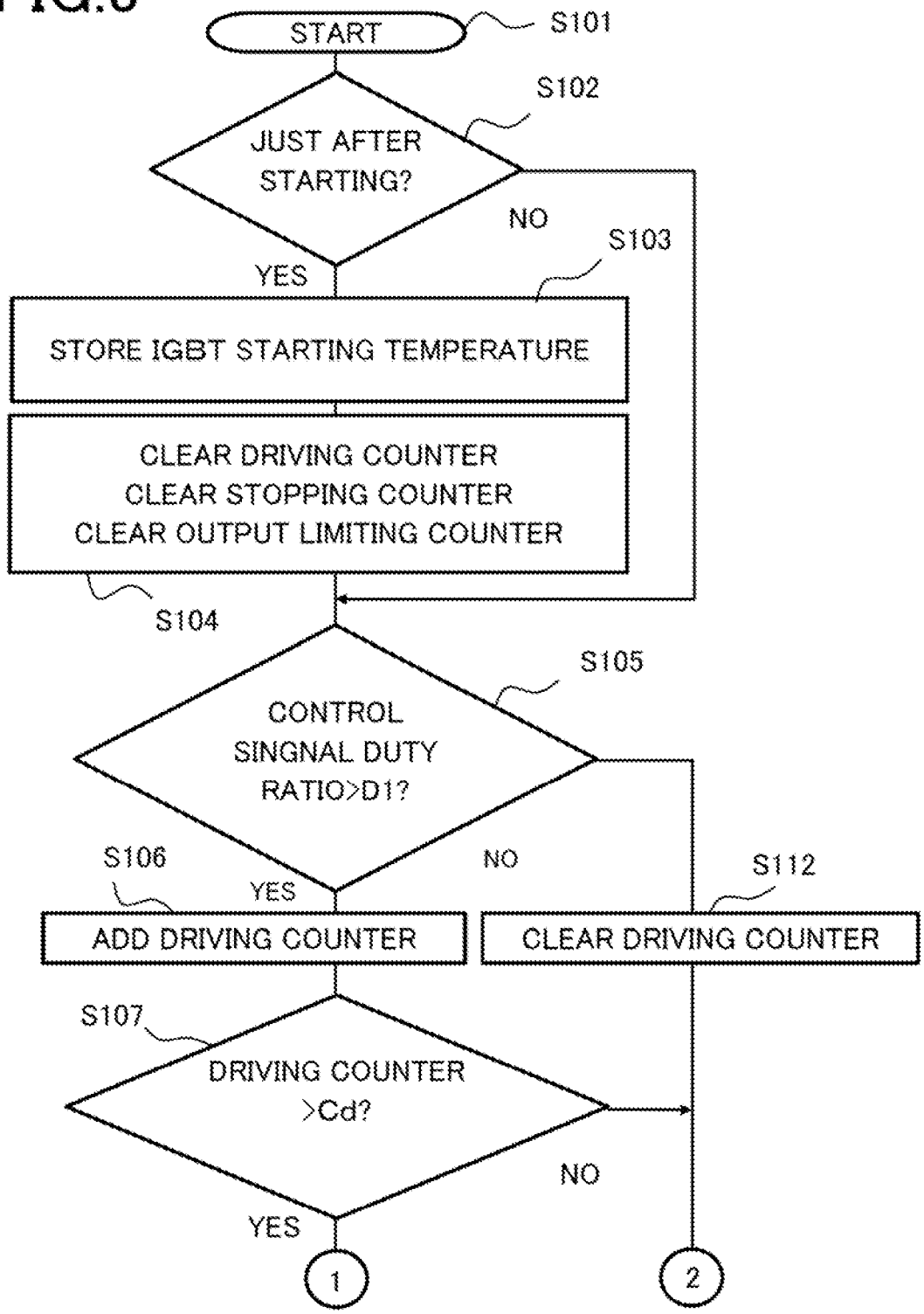
FIG. 5 is a first flowchart representing the processing procedure of a temperature-rising failure determination by a temperature detector according to Embodiment 1.
Figure 6:
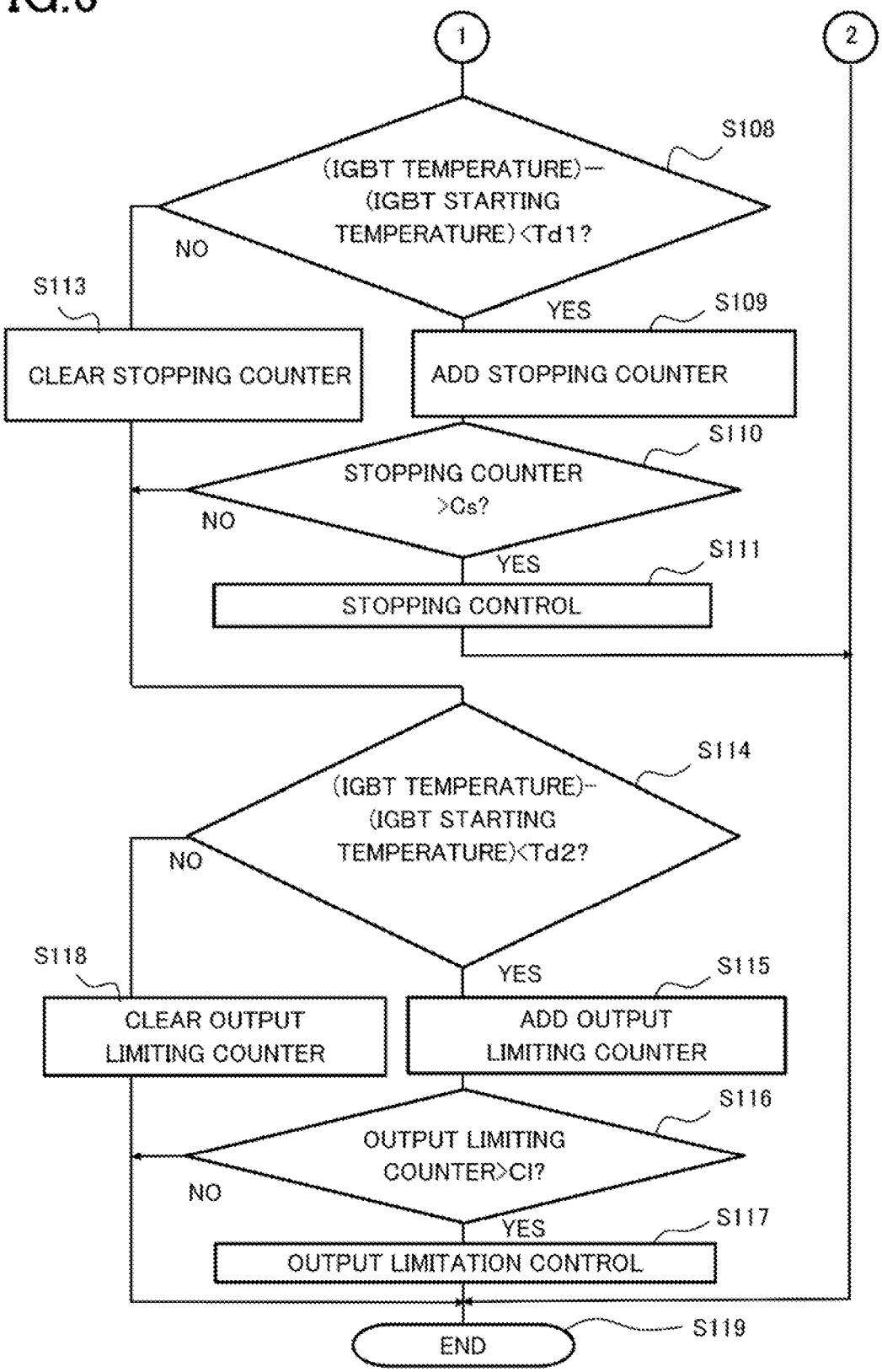
FIG. 6 is a second flowchart representing the processing procedure of the temperature-rising failure determination by the temperature detector according to Embodiment 1.

FIGS. 5 and 6 are a first flowchart and a second flowchart, respectively, representing a processing procedure for the temperature-rising failure determination performed by the temperature detector in the controller 210. The flowchart in FIG. 6 follows the flowchart in FIG. 5. The flowcharts in FIGS. 5 and 6 are implemented every predetermined time (for example, every 5 ms). It may be allowed that the implementation timing is not "every predetermined time" and that the flowcharts are implemented in accordance with a signal that controls the switching device or in accordance with other external events.

In the processing started from the step S101, it is determined in the step S102 whether or not the present timing is immediately after the controller 210 has been started (JUST AFTER STARTING?). In the case where the present timing is not immediately after the controller 210 has been started (the determination is "NO"), the step S102 is followed by the step S105. In the case where the present timing is immediately after the controller 210 has been started (the determination is "YES"), the IGBT temperature detected in the step S103 is stored, as an IGBT starting temperature, in the storage apparatus 91. After that, in the step S104, a driving counter, a stopping counter, and an output limiting counter are cleared; then, the step S104 is followed by the step S105.

In the step S105, it is determined whether or not the duty ratio of a control signal (an on-time ratio of the switching device) is larger than a predetermined driving-determination duty ratio D1 (e.g., 20%). In the case where the determination is "YES", i.e., the duty ratio is larger than the driving-determination duty ratio D1, it is suggested that a current is flowing in the switching device with a load higher than a predetermined one, and hence it can be expected that the temperature of the switching device rises. In this case, the step S105 is followed by the step S106. In the case where the determination is "NO", the step S105 is followed by the step S112, where the driving counter is cleared; then, in the step S119, the processing is ended. In the present embodiment, an example in which the driving-determination duty ratio D1 is 20% has been explained; however, it may be allowed that the driving-determination duty ratio D1 is set to 0% and there is made a condition saying that "in the case where the duty ratio of the driving signal is larger than 0%, i.e., in the case where the switching device is driven".

In the step S106, the driving counter is incremented; then, the step S106 is followed by the step S107. The driving counter is to count the time during which the switching device is driven with a load corresponding to a duty ratio larger than the driving-determination duty ratio D1. In the step S107, it is determined whether or not the value of the driving counter is larger than a predetermined driving-determination count value Cd (e.g., 1 sec.). In the case where the value of the driving counter is not larger than the predetermined driving-determination count value Cd (the determination is "NO"), the step S107 is followed by the step S119, where the processing is ended. In the case where the value of the driving counter is larger than the predetermined driving-determination count value Cd (the determination is "YES"), the step S107 is followed by the step S108.

In the step S108, it is determined whether or not the difference between the detected IGBT temperature and the IGBT starting temperature read from the storage apparatus 91 (IGBT temperature—IGBT starting temperature), i.e., the heating-up temperature is lower than a predetermined first driving temperature Td1. In the case where the heating-up temperature is not lower than the first driving temperature Td1 (the determination is "NO"), the step S108 is followed by the step S113, where the stopping counter is cleared; then, the step S113 is followed by the step S114. In the case where the heating-up temperature is lower than the first driving temperature Td1 (the determination is "YES"), the stopping counter is incremented in the step S109. The above situation suggests a case where although because the switching device is driven at a duty ratio larger than the driving-determination duty ratio D1 for a time exceeding the driving-determination count value, the switching device originally should generate heat and heat up, the heating-up temperature is lower than the first driving temperature Td1 (the switching device has a temperature-rising failure). In this situation, disconnection in the switching device can be presumed; thus, because it is determined that the switching device is not normally driven and hence the current detection function of the switching device has been lost, the stopping counter for stopping the drive is incremented. After that, the step S109 is followed by the step S110.

In the step S110, it is determined whether or not the value of the stopping counter is larger than a predetermined stop-determination time Cs. In the case where the value of the stopping counter is not larger than the predetermined stop-determination time Cs (the determination is "NO"), the step S110 is followed by the step S114. In the case where the value of the stopping counter is larger than the predetermined stop-determination time Cs (the determination is "YES"), stopping control is implemented in the step S111. In the case where a temperature-rising failure is determined not instantaneously but continuously, the determination of the temperature-rising failure is established and stopping processing of the switching apparatus 9 is rapidly performed, so that the switching device can be prevented from being damaged. After the step S111, the processing is ended in the step S119.

In the step S114, it is determined whether or not the difference between the detected IGBT temperature and the IGBT starting temperature read from the storage apparatus 91 (IGBT temperature—IGBT starting temperature), i.e., the heating-up temperature is lower than a second driving temperature Td2, which is higher than the first driving temperature Td1. In the case where the heating-up temperature is not lower than the second driving temperature Td2 (the determination is "NO"), the step S114 is followed by the step S118, where the output limiting counter is cleared; then, in the step S119, the processing is ended. In the case where the heating-up temperature is lower than the second driving temperature Td2 (the determination is "YES"), the output limiting counter is incremented in the step S115; then, the step S115 is followed by the step S116. Even in the case where the heating-up temperature is lower than the second driving temperature Td2, disconnection cannot be determined; however, because the temperature rise in the switching device is small, the output limiting counter is incremented in consideration of malfunction of the switching device.

In the step S116, it is determined whether or not the value of the output limiting counter is larger than a predetermined output-limitation determination time C1. In the case where the value of the output limiting counter is not larger than the predetermined output-limitation determination time C1 (the determination is "NO"), the step S116 is followed by the step S119, where the processing is ended. In the case where the value of the output limiting counter is larger than the output-limitation determination time C1 (the determination is "YES"), output-limitation control is implemented in the step S117. In the case where an output-limitation flag is set not instantaneously but continuously, output-limitation processing of the switching apparatus 9 is rapidly performed, so that the switching device can be prevented from being damaged. After the step S117, the processing is ended in the step S119.

In the flowchart represented in FIG. 6, (IGBT temperature—IGBT starting temperature), i.e., the heating-up temperature is compared with each of the predetermined first driving temperature Td1 and the second driving temperature Td2, and then the stopping counter or the output limiting counter is incremented. However, it may be allowed that the IGBT starting temperature is omitted and that the present IGBT temperature is compared with each of the predetermined first driving temperature Td1 and the second driving temperature Td2. That is because in the case where the switching device is driven at a duty ratio larger than the driving-determination duty ratio D1 or a time exceeding the driving-determination count value, it can be determined that the effect of the IGBT starting temperature to the heat-generation temperature of the switching device is limited.

In the case where the IGBT starting temperature is omitted, it may be allowed that each of the first driving temperature Td1 and the second driving temperature Td2 is a function of the cooler temperature detected by the cooler-temperature detection thermistor 7 or the ambient temperature of the switching apparatus 9 or the electric-power conversion apparatus 10. That is because as the cooler temperature or the ambient temperature is lower, the temperature around the switching device becomes lower and hence the detection temperatures of the temperature-detection diodes 24a and 24b are also influenced. The function may be defined by a map; setting of the function or the map can be obtained by an experiment.

Moreover, with regard to the comparison of the IGBT temperature in the flowchart represented in FIG. 6, it may be allowed that the value obtained by subtracting the cooler temperature or the ambient temperature from the IGBT temperature is compared with each of the predetermined first driving temperature Td1 and the second driving temperature Td2 and then a stop flag or the output-limitation flag is set. That is because that method makes it possible that the temperature comparison is accurately performed while eliminating the effect of the cooler temperature or the ambient temperature.

In the flowcharts in FIGS. 5 and 6, there has been described the processing, performed by the controller 210, of the respective switching devices in each of which a temperature detector is provided; however, the description can be applied also to the processing, performed by the controller 210, of the lower arm 20 and the upper arm 30 in the electric-power conversion apparatus 10. The controller 210 may be provided in each of the switching apparatus 9, the lower arm 20, and the upper arm 30; however, a single integrated controller 210 may be provided, as a whole, in the electric-power conversion apparatus 10.

The above procedure make it possible that by use of the output of the temperature detector, a temperature-rising failure of the switching device is determined and that it is determined that a disconnection in the switching device has caused the switching apparatus 9 to lose the current detection function. As a result, before a large problem occurs in the switching apparatus 9 or the electric-power conversion apparatus 10, switching control and electric-power conversion control can be stopped or output limitation can be performed. In the switching apparatus 9 and the electric-power conversion apparatus 10 according to Embodiment 1, even when only one IGBT having a temperature detector is provided, overcurrent detection and overheating protection can be performed while the foregoing apparatuses are prevented from operating with the current detector being lost.

The processing procedure for the temperature-rising failure determination represented in FIGS. 5 and 6 can be applied to a switching apparatus in which each of the current detector and the temperature detector is provided in only one of two or more switching devices that are provided in parallel with one another. This method makes it possible that overheating of the switching device and loss of the current detection function are detected and that the chip size of the IGBT is decreased and hence the lengths of signal lines are shortened. As a result, because the module size and the substrate area can be reduced, this method can contribute to downsizing of, weight saving of, and cost reduction for the switching apparatus 9.

In addition, in the case where in this situation, the output of the temperature detector indicates overheating or a temperature-rising failure, a disconnection, a short-to-power fault, a short-to-ground fault, adhesion, or a large error in the temperature detector may be the cause thereof. Accordingly, it may be allowed that each of the various kinds of abnormalities in the temperature detector and overheating or a temperature-rising abnormality are determined in a combined manner. Alternatively, it may be allowed that the various kinds of abnormalities in the temperature detector are separately and finely determined.

2. Embodiment 2

In Embodiment 2, with regard to the switching apparatus 9 and the electric-power conversion apparatus 10 that are configured in the same manner as those in Embodiment 1, the procedure of a determination on a temperature-rising failure through temperature detection is changed. The hardware configurations are one and the same.

<Flowchart of Temperature-Rising Failure Determination>

Figure 7:
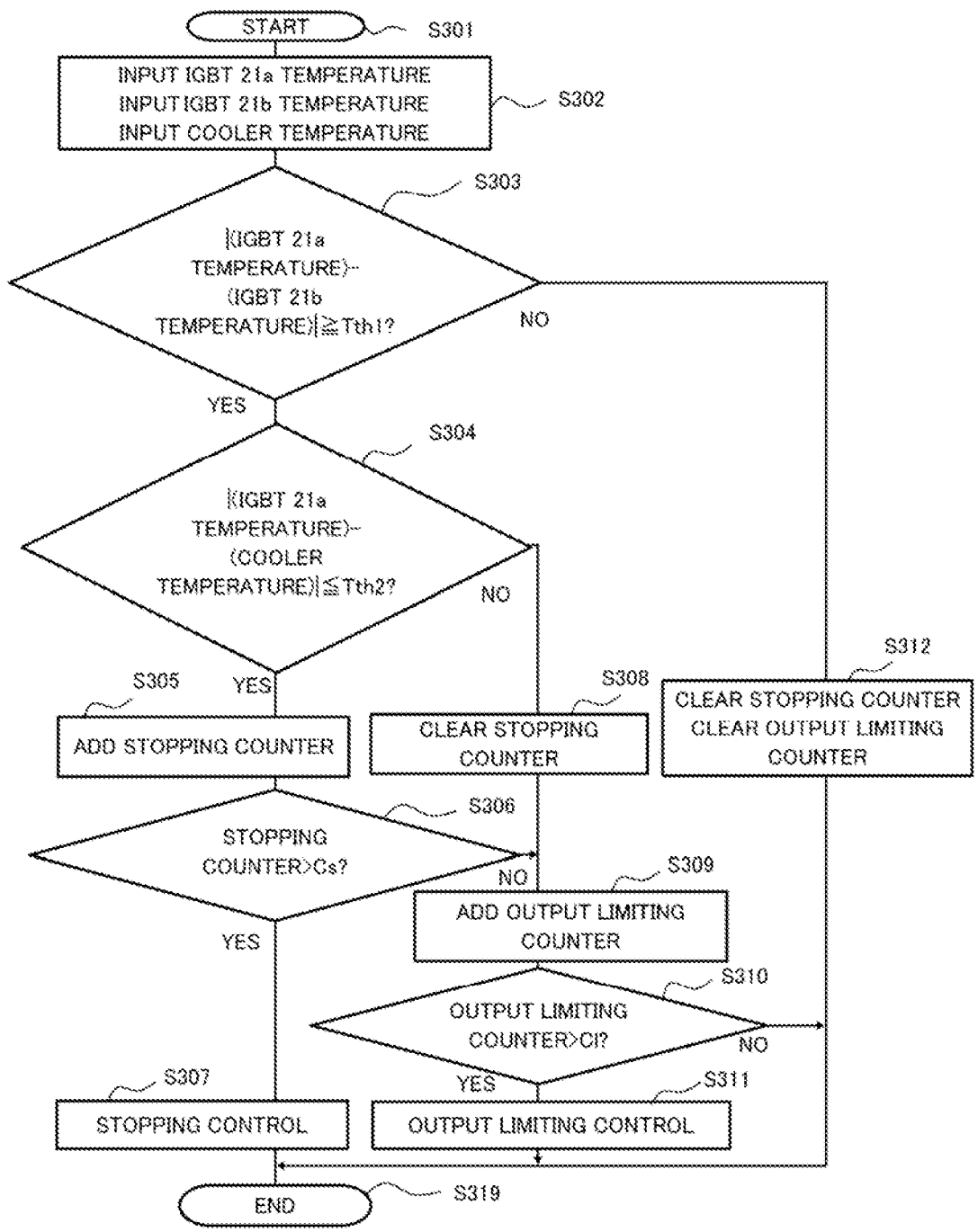
FIG. 7 is a flowchart representing the processing procedure of a temperature-rising failure determination by a temperature detector according to Embodiment 2.

FIG. 7 is a flowchart representing the processing procedure of a temperature-rising failure determination performed by a temperature detector in the controller 210 according to Embodiment 2. The flowcharts in FIG. 7 is implemented every predetermined time (for example, every 5 ms). It may be allowed that the implementation timing is not "every predetermined time" and that the flowchart is implemented in accordance with a signal that controls the switching device or in accordance with other external events.

After the processing in the step S302, where the respective temperatures of the IGBT 21a and 21b and the cooler temperature are taken in, the processing started in the step S301 is followed by the processing in the step S303. In the step S303, it is determined whether or not the absolute value of a difference between the temperature of the IGBT 21a and the temperature of the IGBT 21b is the same as or larger than a first temperature threshold value Tth1. In the case where the absolute value of the difference between the temperature of the IGBT 21a and the temperature of the IGBT 21b is the same as or larger than the first temperature threshold value Tth1, it is suggested that there exists a large difference between the respective temperatures of the two IGBTs; thus, it can be determined that an abnormality exists and hence at least output control should be implemented. In the case where the absolute value of the difference between the temperature of the IGBT 21a and the temperature of the IGBT 21b is the same as or larger than the first temperature threshold value Tth1, (the determination is "YES"), the step S303 is followed by the step S304. In the case where the absolute value of the difference between the temperature of the IGBT 21a and the temperature of the IGBT 21b is not the same as or larger than the first temperature threshold value Tth1, (the determination is "NO"), the step S303 is followed by the step S312, where the stopping counter and the output limiting counter are cleared; then, the processing is ended in the step S319.

In the step S304, it is determined whether or not the absolute value of a difference between the temperature of the IGBT 21a and the cooler temperature is the same as or smaller than a second temperature threshold value Tth2. In this situation, the temperature of the IGBT 21a and the cooler temperature are compared with each other, and in the case where the temperature difference therebetween is the same as or smaller than the second temperature threshold value Tth2 (the determination is "YES"), it is determined that there exists an abnormality in which the IGBT 21a is not conductive due to an open failure and the temperature thereof does not rise. Accordingly, in the step S305, the stopping counter is incremented; then, the step S305 is followed by the step S306.

In the case where the temperature difference therebetween is not the same as or smaller than the second temperature threshold value Tth2 (the determination is "NO"), the step S304 is followed by the step S308, where the stopping counter is cleared; then, the step S308 is followed by the step S309, where the output limiting counter is incremented. The output limiting counter is a counter for performing output-limitation control in which because it is conceivable that there exists some sort of abnormality other than the open failure in the IGBT 21a, the operation is continued while the output electric power is limited. After that, the step S309 is followed by the step S310. The first temperature threshold value Tth1 and the second temperature threshold value Tth2 are determined by considering a variation in the circuit such as the temperature-detection diode, a variation in the ramified currents of the parallel IGBTs, heat transfer from the other IGBTs, and the like.

In the step S306, it is determined whether or not the value of the stopping counter is larger than the predetermined stop-determination time Cs. In the case where the value of the stopping counter is not larger than the predetermined stop-determination time Cs (the determination is "NO"), the step S306 is followed by the step S309. In the case where the value of the stopping counter is larger than the predetermined stop-determination time Cs (the determination is "YES"), the determination of the temperature-rising failure is established and stopping control is implemented in the step S307. In the case where the temperature-rising failure is determined not instantaneously but continuously, stopping processing of the switching apparatus 9 is rapidly performed, so that the switching device can be prevented from being damaged. After the step S307, the processing is ended in the step S319.

In the step S310, it is determined whether or not the value of the output limiting counter is larger than the predetermined output-limitation determination time C1. In the case where the value of the output limiting counter is not larger than the predetermined output-limitation determination time C1 (the determination is "NO"), the step S310 is followed by the step S319, where the processing is ended. In the case where the value of the output limiting counter is larger than the output-limitation determination time C1 (the determination is "YES"), output-limitation control is implemented in the step S311. In the case where the output limitation is determined not instantaneously but continuously, output-limitation processing of the switching apparatus 9 is rapidly performed, so that the switching device can be prevented from being damaged. After the step S311, the processing is ended in the step S319.

In the switching apparatus 9 according to Embodiment 2 and the electric-power conversion apparatus 10 in which the switching apparatus 9 is utilized in each of the lower arm 20 and the upper arm 30, the IGBT 21a, among the two or more IGBTs that are connected in parallel with one another, that is provided with a current detector has also a temperature detector, and the control circuit 6 makes a determination on a temperature abnormality; thus, determination of a temperature-rising failure at a time when the IGBT 21a having the current detector has an open failure makes it possible to detect the loss of the current detection function. In addition, when any one of the IGBTs 21b and 21c having no current detector has an open failure, the current in the switching apparatus 9 can be detected and hence overheating protection thereof can be performed. As a result, while the operation is prevented from being continued with the current detection function being lost, overcurrent protection and overheating protection of the switching apparatus 9 and the electric-power conversion apparatus 10 can be performed.

Even when the number of the IGBTs each having a current detector is smaller than the total number of the parallel IGBTs, it is made possible to prevent the operation from being continued with the protection function being lost; therefore, the cost, the module size of the IGBT, and the substrate area can be reduced.

In the case where two or more IGBTs each having a temperature detector are provided in one and the same arm, a temperature-rising failure can be determined by comparing the respective temperatures of the IGBTs in the arm. The temperature of the IGBT having an open failure does not rise, and current concentration in the other IGBTs each having no open failure makes the temperatures thereof rise more than those at a normal time; therefore, the difference between the temperature of the IGBT having an open failure and each of the normal IGBTs facilitates a determination on the temperature-rising failure. Accordingly, comparison of the respective temperatures of two or more IGBTs is significant.

In the electric-power conversion apparatus 10 having a main circuit configuration provided with the lower arm 20 and the upper arm 30, the problem of the period in which the current detection function cannot be performed can be avoided in each of the lower arm 20 and the upper arm 30. Furthermore, even when the circuit is configured in such a way that each of the lower arm 20 and the upper arm 30 has a driving circuit having an overcurrent protection means and the overcurrent protection means in the driving circuit does not perform overcurrent detection, for example, during a gate-off period, the same effect can be obtained. That is because the lower arm 20 and the upper arm 30 turn on or off at respective different timings that are complementary to each other and hence the respective periods in each of which overcurrent detection is not performed are different from each other, so that the respective periods can mutually be covered. Then, the temperature of each of the switching devices is detected so as to determine a temperature-rising failure, so that the loss of a current detection function can be detected and hence the reliability can be raised.

When there is utilized the fact that because the IGBT having an open failure generates no heat, the temperature thereof becomes close to the cooler temperature, identification of the IGBT having an open failure is facilitated through comparison with the cooler temperature from the cooler-temperature detection thermistor 7. Although when the cooler temperature changes, the effect is provided to the temperature of the IGBT, comparison with the cooler temperature cancels the effect.

The IGBT having a temperature-rising failure can be identified by comparing three or more temperature information pieces such as the respective temperatures of two IGBTs in the lower arm 20 and the upper arm 30. There can be solved a problem that comparison of only two temperature information pieces cannot determine which temperature is abnormal. In addition, the IGBT having a temperature-rising failure may be detected by comparing the respective temperatures of three or more IGBTs in one and the same arm or in different arms. In that case, it is made possible that the IGBT whose temperature is lower by a temperature exceeding a predetermined temperature than the temperatures of the other IGBTs is identified and then it is determined that the foregoing IGBT has a temperature-rising failure. Alternatively, it may be allowed that the IGBT whose temperature is lower by a temperature exceeding a predetermined temperature than the average value of the temperatures of the IGBTs is identified and then it is determined that the foregoing IGBT has a temperature-rising failure.

In the case where it is determined that the IGBT having a current detection function has a temperature-rising failure, the operation of each of the switching apparatus and the electric-power conversion apparatus is stopped, so that it is made possible to prevent the operation from being continued with the current detection function being lost due to an open failure. Accordingly, the reliability can be raised; thus, there exists large significance.

In the case where it is determined that the IGBT having no current detection function has a temperature-rising failure, the operation of each of the switching apparatus and the electric-power conversion apparatus is continued while the outputs thereof are limited, so that it is made possible that even when there exists an abnormality, the operation can be continued as long as possible. Thus, because the operation of each of the switching apparatus and the electric-power conversion apparatus can be continued, failure resistance of the system can be raised.

In Embodiment 2, FIG. 3 has represented a case where the number of IGBTs each having a current detector in an arm is only one. However, it may be allowed that the number of IGBTs each having a current detector is two or more. For example, in some cases, there exists a case where two IGBTs out of three parallel IGBTs each have a current detector so that protection threshold values with which overcurrent protection is established can be set while variations in conduction currents within an arm are considered. However, even when only one of the IGBTs each having a current detector has an open failure, the overcurrent protection function is lost. In contrast, when an IGBT having a current detector has also a temperature detector, the loss of a current detection function can be detected based on a temperature-rising failure, as is the case explained in Embodiment 2. Accordingly, because not all of the IGBTs have the current detection functions, the cost is reduced.

In Embodiment 2, as represented in FIG. 3, two IGBTs out of three parallel IGBTs each have a temperature detector in an arm; however, it may be allowed that each of the three IGBTs has a temperature detector. As a result, a temperature-rising failure, caused by an open failure, of each of the IGBTs can be determined.

In Embodiment 2, the cooler-temperature detection thermistor 7 detects the cooler temperature of the electric-power conversion apparatus 10; however, it may be allowed that the temperature of not the cooler but coolant itself such as coolant water or air is detected. Because the cooler temperature becomes close to the temperature of the coolant, the same effect can be obtained. The respective temperatures of the cooler and the coolant may be temperature information pieces obtained from the outside of the electric-power conversion apparatus 10.

The control circuit 6 obtains temperature information pieces from the driving circuits 28 and 38; however, the temperature information pieces may directly be inputted from the IGBTs to the control circuit 6, without intermediary of the driving circuits.

3. Embodiment 3

Figure 8:
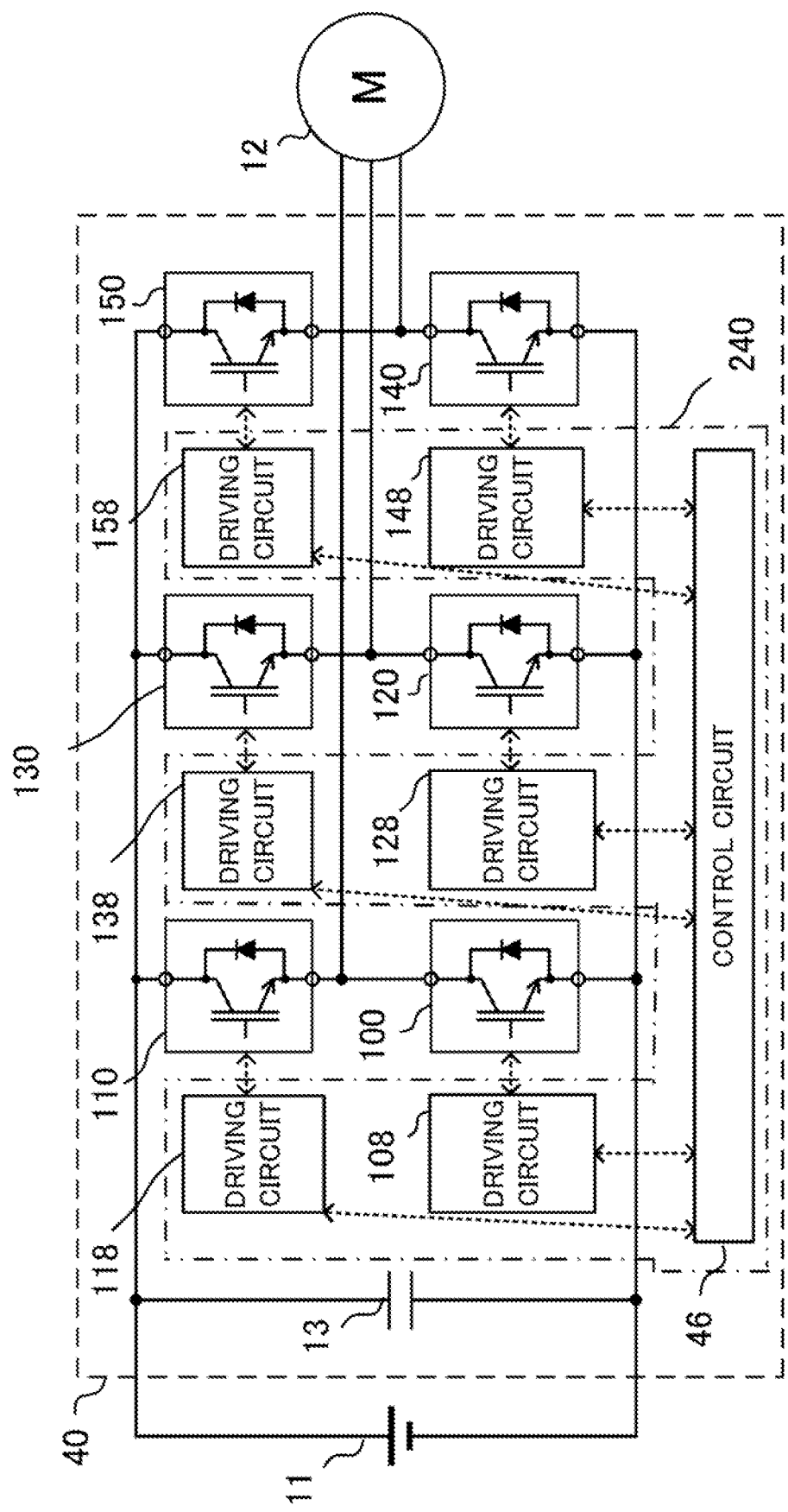
FIG. 8 is a configuration diagram of an electric-power conversion apparatus according to Embodiment 3.

FIG. 8 is a diagram representing the configuration of an electric-power conversion apparatus 40 according to Embodiment 3. The electric-power conversion apparatus 40 is an inverter having lower arms 100, 120, and 140 that each include two or more IGBTs and upper arms 110, 130, and 150 that each include two or more IGBTs; three series circuits, i.e., a series circuit consisting of the upper arm 110 and the lower arm 100, a series circuit consisting of the upper arm 130 and the lower arm 120, and a series circuit consisting of the upper arm 150 and the lower arm 140 are connected in parallel with one another. In FIG. 8, representation of the two or more IGBTs in each of the arms is omitted, and a single IGBT is represented as a representative. An input capacitor 13 and the power source 1 are connected in parallel with the series circuits each consisting of the upper and lower arm; the connection points between the upper arms and the respective corresponding lower arms are each connected with a three-phase motor 12 as a load.

The lower arms 100, 120, and 140 have driving circuits 108, 128, 148, respectively, and the upper arms 110, 130, and 150 have driving circuits 118, 138, 158, respectively; each of the driving circuits is connected with a control circuit 46. The operation of the inverter is performed by switching of the upper and lower arms, based on a command from the control circuit 46; concurrently, the control circuit 46 receives sensing information from each of the arms and then appropriate protection operation is performed based on the sensing information. The controller 240 includes the control circuit 46 and the driving circuits 108, 118, 128, 138, 148, and 158. In FIG. 8, representation of the cooler-temperature detection thermistor 7 is omitted; however, it is assumed that as is the case with FIG. 1, the cooler-temperature detection thermistor 7 is connected with the control circuit 46.

Figure 9:
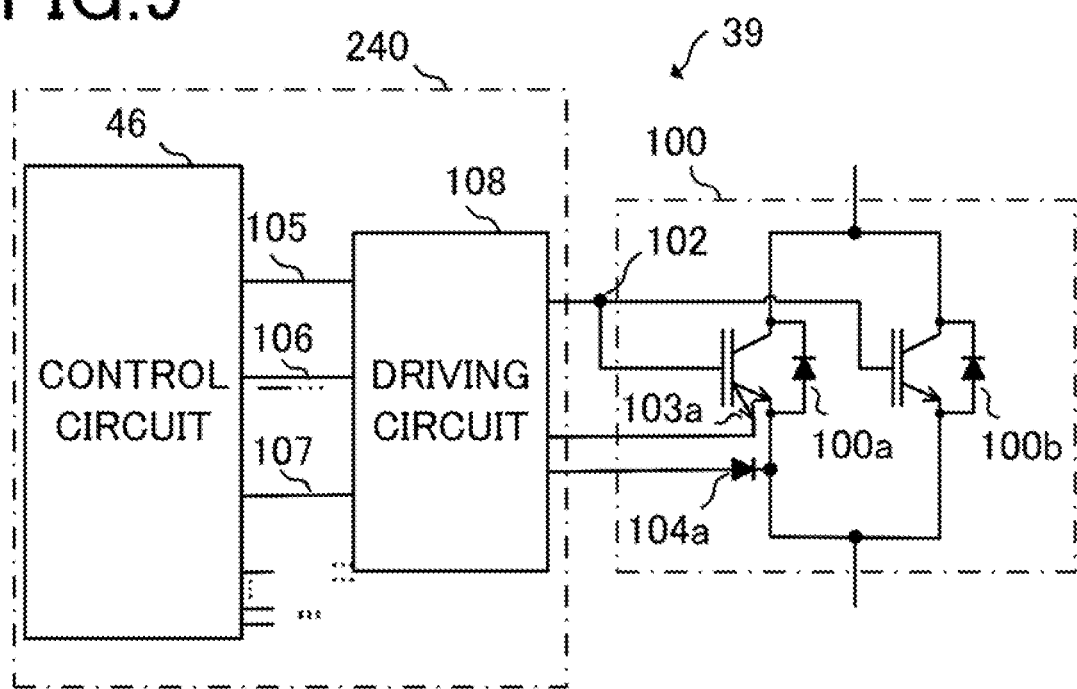
FIG. 9 is a configuration diagram of a switching apparatus according to Embodiment 3.

FIG. 9 represents the detail of the configuration of the lower arm 100 and connection among the lower arm 100, the driving circuit 108, and the control circuit 46 that are integrally included in a switching apparatus 39. In addition, the respective configurations among the upper arms 110, 130, and 150 and the lower arms 120 and 140 and the driving circuits 118, 128, 138, 148, and 158 are the same as the foregoing configuration; therefore, representation therefor will be omitted.

The lower arm 100 includes two IGBTs connected in parallel with each other; a diode is connected with each of IGBTs 100*a* and 100*b* in an anti-parallel manner. The IGBT 100*a* has a current-detection cell 103*a*, which is a current detector, and a temperature-detection diode 104*a*, which is a temperature detector of the IGBT 100*a*, and transmits current information and temperature information to the driving circuit 108.

The respective gate terminals of the IGBTs 100*a* and 100*b* are connected with one another by a common gate driving signal line 102; a gate signal to be outputted from the driving circuit 108 on/off-drives the IGBTs 100*a* and 100*b*. The driving circuit 108 outputs, as a gate driving signal, a PWM signal 105 outputted from the control circuit 46 to the gate driving signal line 102.

The driving circuit 108 has an overcurrent protection means, receives current information from the current-detection cell 103*a* so as to perform overcurrent protection, and transmits an overcurrent abnormality signal 106 to the control circuit 46. The driving circuit 108 transmits, as a temperature signal 107, temperature information received from the temperature-detection diode 104*a* to the control circuit 46; a temperature abnormality detector provided in the control circuit 46 detects a temperature abnormality in the IGBT 100*a*.

The operational principle, for electric-power conversion, of the electric-power conversion apparatus 40 will be explained. Line-to-line voltages and phase voltages of the three-phase motor 12 are generated by on/off-controlling the lower arms 100, 120, and 140 and the upper arms 110, 130, and 150, so that the three-phase motor 12 is controlled.

The current detection circuit in the driving circuit 108 is the same as that in FIG. 4 in each of Embodiments 1 and 2; therefore, the explanation therefor will be omitted.

The method through which a temperature abnormality is detection by the electric-power conversion apparatus 40 and the operation at a time of a temperature abnormality will be explained. The control circuit 46 detects a temperature abnormality by use of the respective IGBT temperatures of the IGBT 100a, and IGBTs 110a, 120a, 130a, 140a, and 150a (110a through 150a are not represented), which are transmitted, as respective temperature signals, from the driving circuits 108, 118, 128, 138, 148, and 158. When any one of the IGBT temperatures or the cooler temperature exceeds a predetermined temperature, the control circuit 46 determines that overheating has occurred, decreases the output electric power, and then continues the operation or performs overheating protection in which the operation is stopped; in addition to this, the control circuit 46 determines a temperature-rising failure, based on the following procedure.

A temperature-rising failure is determined by comparing the IGBT temperature of the lower arm 100 in the electric-power conversion apparatus 40 with each of the IGBT temperatures of the lower arms 120 and 140. In other words, in the case where the absolute value of a difference between the temperature of the IGBT 100a and the temperature of the IGBT 120a is the same as or larger than a third temperature threshold value Tth3 (unrepresented), the absolute value of a difference between the temperature of the IGBT 100a and the temperature of the IGBT 140a is the same as or larger than the third temperature threshold value Tth3, the temperature of the IGBT 100a<the temperature of the IGBT 120a, and the temperature of the IGBT 100a<the temperature of the IGBT 140a, a temperature-rising failure is determined.

Similarly, a temperature-rising failure is determined by comparing the IGBT temperature of the upper arm 110 with each of the IGBT temperatures of the lower arms 120 and 140. In other words, in the case where the absolute value of a difference between the temperature of the IGBT 110a and the temperature of the IGBT 130a is the same as or larger than the third temperature threshold value Tth3, the absolute value of a difference between the temperature of the IGBT 110a and the temperature of the IGBT 150a is the same as or larger than the third temperature threshold value Tth3, the temperature of the IGBT 110a<the temperature of the IGBT 130a, and the temperature of the IGBT 110a<the temperature of the IGBT 150a, a temperature-rising failure is determined.

A temperature-rising failure of the IGBT 100a in the lower arm 100 can be determined by comparing the temperature of the IGBT 100a with each of the respective temperatures of the IGBTs 120a and 140a of the other phases. A temperature-rising failure of the IGBT 110a in the upper arm 110 can also be determined by comparing the temperature of the IGBT 110a with each of the respective temperatures of the IGBTs 130a and 150a of the other phases. A temperature-rising failure in each of the other lower arms 120 and 140 and the other upper arms 130 and 150 can also be determined in the same way of thinking. In the case where based on the foregoing determination condition, a temperature-rising failure is determined, there exists the probability of a temperature-rising failure caused by an open failure in the IGBT and hence there exists the probability that the current detection function has been lost; therefore, the operation is stopped. The third temperature threshold value Tth3 is determined by considering a variation in the circuit such as the temperature-detection diode, a variation in the ramified currents of the parallel IGBTs, heat transfer from the other IGBTs, and the like.

In the configuration including two or more phases for which as in the electric-power conversion apparatus 40, two or more pairs of upper and lower arms are connected in parallel with one another, the respective temperature information pieces of IGBTs of two or more phases are compared with one another, so that a temperature-rising failure can be determined through comparison of more IGBT temperatures. In particular, in the case where the number of the temperature detectors in an arm is small, a temperature-rising failure can be determined through comparison with the temperature of the IGBT in another phase. Moreover, the respective loss amounts caused in switching devices such as IGBTs in an upper arm and in a lower arm differ from each other; thus, a temperature-rising failure can more accurately be determined by comparing the temperatures of the IGBTS within the upper arms or the lower arms of each of the phases.

In Embodiment 3, there has been described an example where the temperatures of the IGBTS within upper arms or within lower arms are compared; however, it may be allowed that a temperature-rising failure is determined by comparing the temperature of the IGBT in an upper arm with the temperature of the IGBT in a lower arm. It is desirable that in order to identify a failure point, three or more temperature information pieces are compared with one another.

In each of Embodiments 1 and 2, a temperature-rising failure is determined based on whether or not each of the differences between the temperatures of two or more IGBTs or between the cooler temperature and each of the temperatures of the IGBTs is larger or smaller than a predetermined temperature threshold value; however, the method of determining a temperature-rising failure is not limited thereto, and any method may be allowed, as long as an abnormality is detected by use of temperature information.

Although the present application is described above in terms of various exemplary embodiments and implementations, it should be understood that the various features, aspects and functions described in one or more of the individual embodiments are not limited in their applicability to the particular embodiment with which they are described, but instead can be applied, alone or in various combinations to one or more of the embodiments. Therefore, an infinite number of unexemplified variant examples are conceivable within the range of the technology disclosed in the present disclosure. For example, there are included the case where at least one constituent element is modified, added, or omitted and the case where at least one constituent element is extracted and then combined with constituent elements of other embodiments.

What is claimed is:

1. A switching apparatus comprising:
    two or more switching devices that are connected in parallel with one another and each of which switches conduction to/from cutoff between a first terminal and a second terminal in accordance with an input signal to a control terminal;
    a current detector and a temperature detector provided in at least one of the two or more switching devices; and
    a controller that is connected with the control terminal, the current detector, and the temperature detector, that switches on/off of the switching device, that determines an overcurrent in the switching device in which the current detector is provided, based on an output of the current detector, that determines overheating and a temperature-rising failure, wherein the temperature-rising failure signifies an insufficient heating-up temperature with driving the switching device, in the switching device in which the temperature detector is provided, based on an output of the temperature detector, and that controls the two or more switching devices, based on a result of a determination on the overcurrent and respective results on the overheating and the temperature-rising failure.

2. The switching apparatus according to claim 1, wherein the temperature detectors are provided in two or more switching devices including at least the switching device in which the current detector is provided, among the two or more switching devices, and wherein the controller determines a temperature-rising failure in the switching device by comparing respective outputs of the two or more temperature detectors.

3. The switching apparatus according to claim 1, further comprising a cooler for cooling the switching device, and a cooler-temperature detector for detecting a temperature of the cooler, wherein the controller determines a temperature-rising failure in the switching device, based on respective outputs of the temperature detector and the cooler-temperature detector.

4. The switching apparatus according to claim 1, wherein the controller determines a temperature-rising failure in the switching device, based on an output of the temperature detector at a time of starting and an output of the temperature detector at a time after starting.

5. The switching apparatus according to claim 1, wherein the number of the current detectors is smaller than the number of the switching devices.

6. The switching apparatus according to claim 1, wherein the single current detector is provided.

7. The switching apparatus according to claim 1,
wherein the number of the temperature detectors provided is three or more, and wherein the controller determines a temperature-rising failure in the switching device by comparing respective outputs of the three or more temperature detectors.

8. The switching apparatus according to claim 1, wherein the temperature detector is provided in each of the switching devices.

9. The switching apparatus according to claim 1, wherein the single temperature detector is provided.

10. The switching apparatus according to claim 1, wherein when determining a temperature-rising failure in the switching device, the controller turns off the two or more switching devices.

11. The switching apparatus according to claim 1, wherein when determining a temperature-rising failure in the switching device in which not the current detector but the temperature detector is provided, the controller continues turning on/off of the two or more switching devices.

12. An electric-power converter having an upper arm and a lower arm that are connected in series with each other and that supply a positive-polarity current and a negative-polarity current, respectively, wherein the switching apparatus according to claim 1 is utilized in each of the upper arm and the lower arm.

13. The electric-power converter according to claim 12, wherein the controller detects a current in the switching device during a conduction period thereof.

14. The electric-power converter according to claim 12, further comprising two or more sets of the upper and lower arms that are connected in series with each other, wherein the controller determines a temperature-rising failure in the switching device by comparing respective outputs of temperature detectors provided in different sets.

15. The electric-power converter according to claim 14, wherein the controller determines a temperature-rising failure in the switching device by comparing respective outputs of temperature detectors provided in the upper arms in different sets, among the two or more sets of the upper and lower arms that are connected in series with each other.

16. The electric-power converter according to claim 14, wherein the controller determines a temperature-rising failure in the switching device by comparing respective outputs of temperature detectors provided in the lower arms in different sets, among the two or more sets of the upper and lower arms that are connected in series with each other.

17. The electric-power converter according to claim 12, wherein the controller determines a temperature-rising failure in the switching device by comparing an output of a temperature detector provided in the upper arm with an output of a temperature detector provided in the lower arm.

18. The electric-power converter according to claim 12, wherein the controller determines a temperature-rising failure in the switching device, based on respective outputs of the three or more temperature detectors.

19. The electric-power converter according to claim 12, wherein when determining a temperature-rising failure in the switching device, the controller stops electric-power conversion.

20. The electric-power converter according to claim 12, wherein when determining a temperature-rising failure in the switching device in which not the current detector but the temperature detector is provided, the controller continues electric-power conversion.

* * * * *